(12) United States Patent
La Placa et al.

(10) Patent No.: US 7,750,688 B2
(45) Date of Patent: Jul. 6, 2010

(54) HIGH SPEED CMOS OUTPUT BUFFER FOR NONVOLATILE MEMORY DEVICES

(75) Inventors: Michele La Placa, Cefalù (IT); Ignazio Martines, Tremestieri Etneo (IT)

(73) Assignee: STMicroelectronics S.R.L., Agrate Brianza, MI (IT)

( * ) Notice: Subject to any disclaimer, the term of this patent is extended or adjusted under 35 U.S.C. 154(b) by 126 days.

(21) Appl. No.: 12/204,084

(22) Filed: Sep. 4, 2008

(65) Prior Publication Data
US 2009/0066372 A1      Mar. 12, 2009

(30) Foreign Application Priority Data
Sep. 11, 2007   (IT) ................. VA2007A0072

(51) Int. Cl.
*H03B 1/00* (2006.01)
*H03K 3/00* (2006.01)

(52) U.S. Cl. .................. 327/108; 327/109; 327/110; 327/111; 327/112; 326/26; 326/27; 326/87; 326/112

(58) Field of Classification Search ............. 327/108, 327/109, 110, 112; 326/26, 27, 87, 112
See application file for complete search history.

(56) References Cited

U.S. PATENT DOCUMENTS

| 6,265,892 B1 * | 7/2001 | Jou et al. ............... 326/27 |
| 2002/0158674 A1 | 10/2002 | Ang et al. ............. 327/108 |
| 2005/0237085 A1 * | 10/2005 | Ojiro .................... 326/87 |

\* cited by examiner

*Primary Examiner*—Lincoln Donovan
*Assistant Examiner*—John W Poos
(74) *Attorney, Agent, or Firm*—Lisa K. Jorgenson; Allen, Dyer, Doppelt, Milbrath & Gilchrist, P.A.

(57) ABSTRACT

An output CMOS buffer includes MOS enhancement transistors and has a second complementary pair of natural or low threshold transistors, connected respectively in parallel to transistors of opposite type of conductivity of the complementary pair of enhancement MOS transistors of the final buffer stage. The gate terminals of the pair of natural or low threshold transistors are controlled by respective inverters, each supplied through a slew rate limiter of the slope of the driving current and are respectively connected between the positive supply node of the output buffer and a negative (below ground potential) node and between the common ground node of the output buffer and a positive supply node. The negative voltage and the positive voltage on the nodes are at least equal to the absolute value of the threshold voltage of the natural or low threshold transistors.

10 Claims, 7 Drawing Sheets

FIG. 1

(PRIOR ART)

FIG. 2

(PRIOR ART)

FIG. 3

(PRIOR ART)

HIGH SPEED CMOS OUTPUT BUFFER FOR NONVOLATILE MEMORY DEVICES

FIELD OF THE INVENTION

The invention relates to high-speed CMOS output buffers, particularly for memory devices.

BACKGROUND OF THE INVENTION

When lines of interconnection between two circuits are relatively long or the circuits sufficiently fast such that the rise/fall times of signals exchanged between the circuits are comparable with propagation times over the connection line, then interconnection lines must be treated as long transmission lines. Therefore, the line must be properly matched, at least at one end thereof, otherwise signals sent on the line will be reflected to some extent and make transmissions complicated. Impedance mismatchings may be accepted as far as the consequent increase of the time required for reaching steady-state conditions remains inconsequential.

In CMOS buffers, the more convenient matching is carried out at the input end of the line (null DC power consumption), that is, making the output impedance Zout of the line driving buffer equal to the characteristic impedance Z0 of the transmission line. The line load may be represented by a capacitance electrically in parallel with a current generator (typically $|Iol|=-Ioh \leq 100\ \mu A$). When the load capacitance is very small (on the order of pF) the line practically works in open circuit condition. Often the line is not matched at its output end and transmitted signals are reflected.

The reflected wavefront upon reaching the input end of the line sees a dynamic impedance that corresponds to a reversed replica of the instantaneous slope of the output characteristic $id=f(vds)$ of the line driver. Of course, if the output dynamic impedance of the line driving buffer is equal to the characteristic impedance of the line, the wavefront is not reflected back towards the output end of the line. In contrast, a new reflected wave towards the output end is produced, and so on. It is evident that the ability of keeping constant the slope of the output characteristic $id=f(vds)$ instant by instant, over the whole swing of the output voltage Vout, is a desirable characteristic of the driver.

Figure 1:
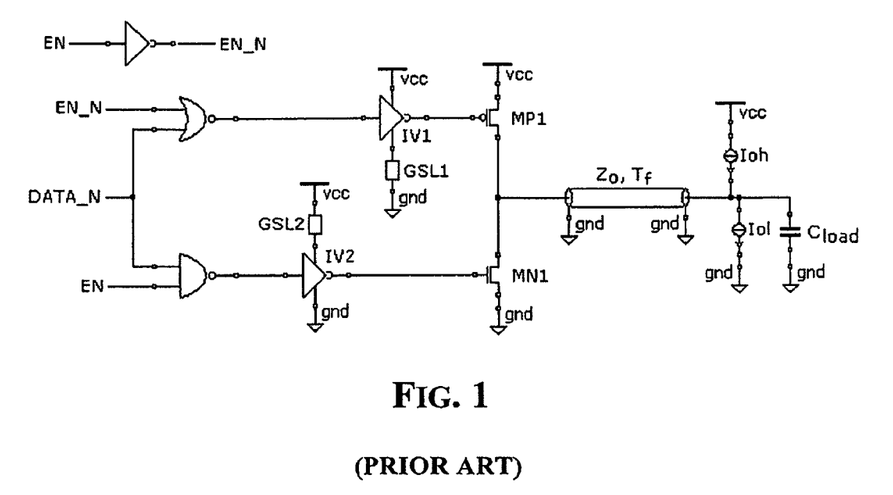
FIG. 1 is a schematic circuit diagram illustrating a conventional output buffer.

FIG. 1 depicts a typical conventional CMOS output buffer. The inverters IV1 and IV2 that drive the gates of the output drivers MP1, MN1 are all provided with gate slew limiters (GSLs) that control the speed of gate signals to limit switching noise on the supply lines and on the lines connecting to ground. These GSLs may be integrated resistors or typically adjustable resistances in the form of a transistor the on-resistance of which is fixed by applying a certain bias voltage to the gate node of the transistor.

This buffer does not satisfy the above mentioned requirements because its output impedance is too large compared to typical values of the characteristic line impedance Z0, as far as the output transistors operate in the saturation region. Only when the output transistors operate in the linear region, the output impedance almost becomes equal to Z0.

Figure 2:
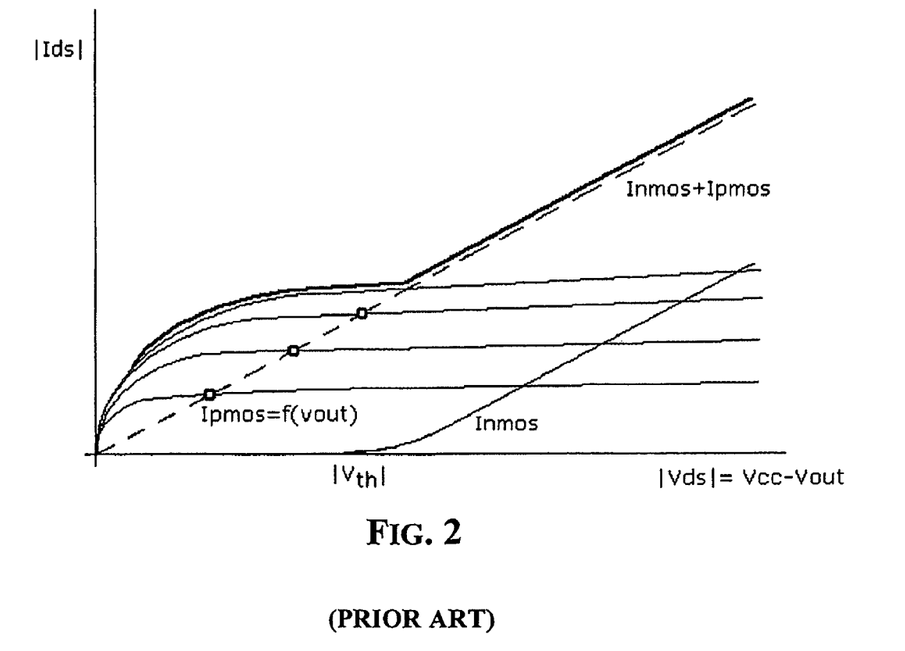
FIG. 2 is a graph illustrating the dynamic behavior of the buffer of FIG. 1.

To address operating conditions it has been proposed to electrically connect a complementary diode-connected MOS transistor in parallel to each driver, that will be in a conduction state as far as $|Vds|=|Vgs|\geq |Vth|$. Enhancement MOS transistors are commonly used for realizing the buffer output stage. They are characterized by a relatively large threshold ($\approx 0.9V$, considering also the "body effect") thus the output buffer characteristic is a piecewise function. An example is shown in FIG. 2, for the case of the "pull up" transistor (bold line). The problem is generally overcome by boosting the driving signals of the gates of the added complementary MOS, even if this implies a significant increase of circuit complexity and an increased silicon area overhead (pump capacitors), the amount of which is comparable with the silicon area occupied by the output MOS transistor.

A further development, in terms of linearity, is obtained with the method described in the published U.S. patent application No. 2002/0158674. According to the disclosed method, the voltage Vgs of the common source drivers is modulated by the output voltage of the buffer. In particular, when Vout increases, the transistor is forced to work with a decreased Vgs. The result is a linearized dynamic characteristic as the one depicted with a dashed line in FIG. 2.

Figure 3:
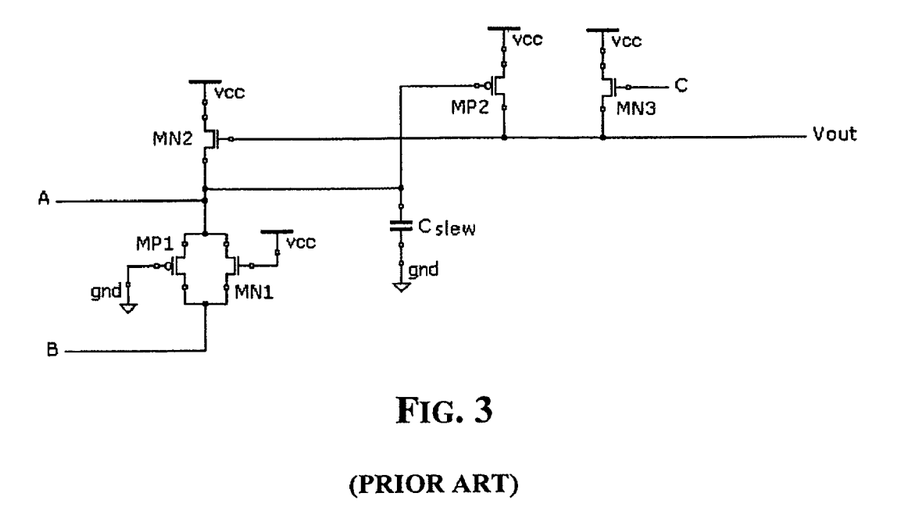
FIG. 3 is a schematic circuit diagram illustrating the pull-up side of an output buffer with a complementary transistor connected to the pull-up transistor according to the prior art.

FIG. 3 depicts in a simplified fashion the circuit that implements the method disclosed in the above publication for the "pull up" side of the output buffer. The output signal Vout switches from low to high, the voltage C is equal to Vcc, the voltage B is null (ground) and the voltage A is left floating (high impedance). The MOS transistors MP2 and MN3 are the pull-up side of the output stage of the buffer, the N-channel MOS MN2 works as a source follower on a load composed of the pair MP1, MN1. The source follower, coupled to the output node, is part of a negative feedback loop of the driver MP2.

The characteristic may be considered linear based upon the faster the response speed and thus the larger the current consumption of the feedback circuit. Such a large power consumption could make it difficult to satisfy the power consumption specifications in stand-by when the output buffers are active (i.e. not in tristate condition). Besides for meeting response speed specifications, the power consumption of the above-mentioned feedback circuit is due to the need of ensuring an adequate overdrive Vgs-Vth to the driver (it must remain turned on), especially if the driver must deliver the current Ioh (or Iol).

These reasons may contrast with stringent requirements of reduced power consumption, for example in nonvolatile memory devices but also in many other applications with some requisites. Moreover, from the characteristics depicted in FIG. 2, it is evident that, in the linear functioning region of the characteristics, the common source MOS has a smaller output resistance than the required resistance, thus the drivers are over-sized, with a larger silicon area consumption.

SUMMARY OF THE INVENTION

An effective way has been found for significantly eliminating or reducing limitations and inefficiencies in realizing a CMOS output buffer for high speed digital applications based on the use of natural complementary transistors, that is transistors with a threshold smaller than the threshold of commonly used enhancement transistors, connected in parallel to transistors of opposite type of conductivity of the complementary enhancement transistor pairs that compose the final inverter stage of the buffer.

The approach does not necessarily imply cost significant changes because numerous fabrication processes of integrated CMOS systems already contemplate the realization of natural transistors besides the enhancement MOS transistors generally used for the managing, control and input/output (I/O) circuitry, such as for example in fabrication processes of nonvolatile memory devices.

Basically, the output CMOS buffer composed of MOS enhancement transistors according to the present approach, has a second complementary pair of natural or low threshold transistors, connected respectively in parallel to transistors of opposite type of conductivity of the complementary pair of enhancement MOS transistors of the final buffer stage. The gate terminals of the pair of natural or low threshold transistors are controlled by respective inverters, each supplied through a slew rate limiter of the slope of the driving current and are respectively connected between the positive supply node of the output buffer and a negative (below ground potential) node and between the common ground node of the output buffer and a positive supply node. The negative voltage and the positive voltage on the nodes are at least equal to the absolute value of the threshold voltage of the natural or low threshold transistors.

According to an embodiment of the output CMOS buffer of the present approach, two source followers made respectively with a natural or low threshold PMOS transistor connected to a positive boosted voltage supply and a natural or low threshold NMOS transistor connected to a boosted negative voltage, generate respectively the positive voltage and the negative voltage the two connection nodes of the respective driving inverters.

To reduce or minimize the contribution to power consumption due to the bias currents of the respective natural PMOS and NMOS transistors absorbed from the respective boosted voltage sources, the two voltages are generated by the use of respective current mirrors insensitive to variations of the supply voltage of the circuit, to temperature and to process "spread", the voltages are held by hold capacitors connected between the supply node of the drivers of the two complementary natural transistors connected in parallel to the enhancement transistors of the output stage of the buffer, and to ground, in one case, and to the supply node of the buffer in the other case. And the control gates of the two natural PMOS and NMOS transistors of the two generators of the two voltages are controlled by a stand-by signal of the integrated system to which the output buffer belongs, such to implement a time-division biasing.

DETAILED DESCRIPTION OF THE PREFERRED EMBODIMENTS

Figure 4:
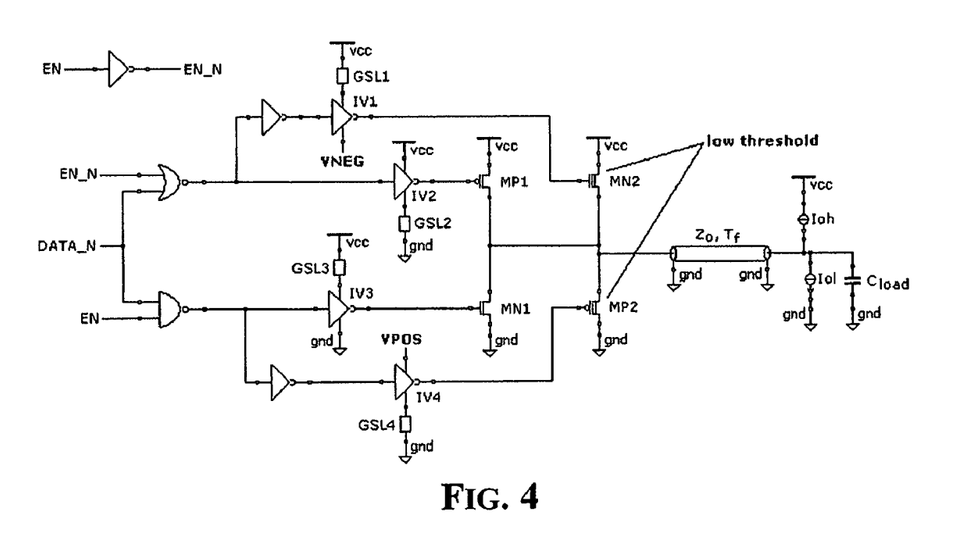
FIG. 4 is a schematic circuit diagram illustrating a buffer of the present invention.

FIG. 4 depicts a basic circuit diagram of an output buffer according to the invention. The natural MOS transistors are MN2, MP2, and the supply terminals of the inverters IV1 and IV4, not connected to the gate slew limiters for controlling the slope of the gate signals of the output drivers (that is the slope of the variation of the gate voltage) (GSL) that are not directly grounded or connected at the voltage Vcc, but to the supply nodes VNEG and VPOS, respectively.

In commanded stand-by conditions, or in self-stand-by conditions, VNEG is negative and its absolute value is relatively small, VPOS is positive and slightly higher than Vcc. The voltages VPOS and VNEG are used for preventing circulation of the under-threshold current through the "low threshold" MOS. These transistors are relatively large and the under-threshold current that flows therethrough may become relatively large and may become uncontrolled because of process spreads, supply fluctuations and temperature variations. They may be turned off completely by applying a negative (positive) gate-source voltage Vgs of appropriate value for NMOS (PMOS) transistors, or incrementing the threshold of the transistor by biasing its bulk region with a negative (positive) voltage.

For enhanced simplicity and effectiveness (proper of a linear relation), the gate nodes instead of the bulk nodes are preferably controlled:

$$VPOS=Vcc+\delta$$

$$VNEG=-\delta$$

wherein $\delta$ is equal to the absolute value of the threshold of the natural MOS, typically around 200 mV. The chosen value ensures the turn off of the transistors and limits the so-called "gate stress".

Figure 5:
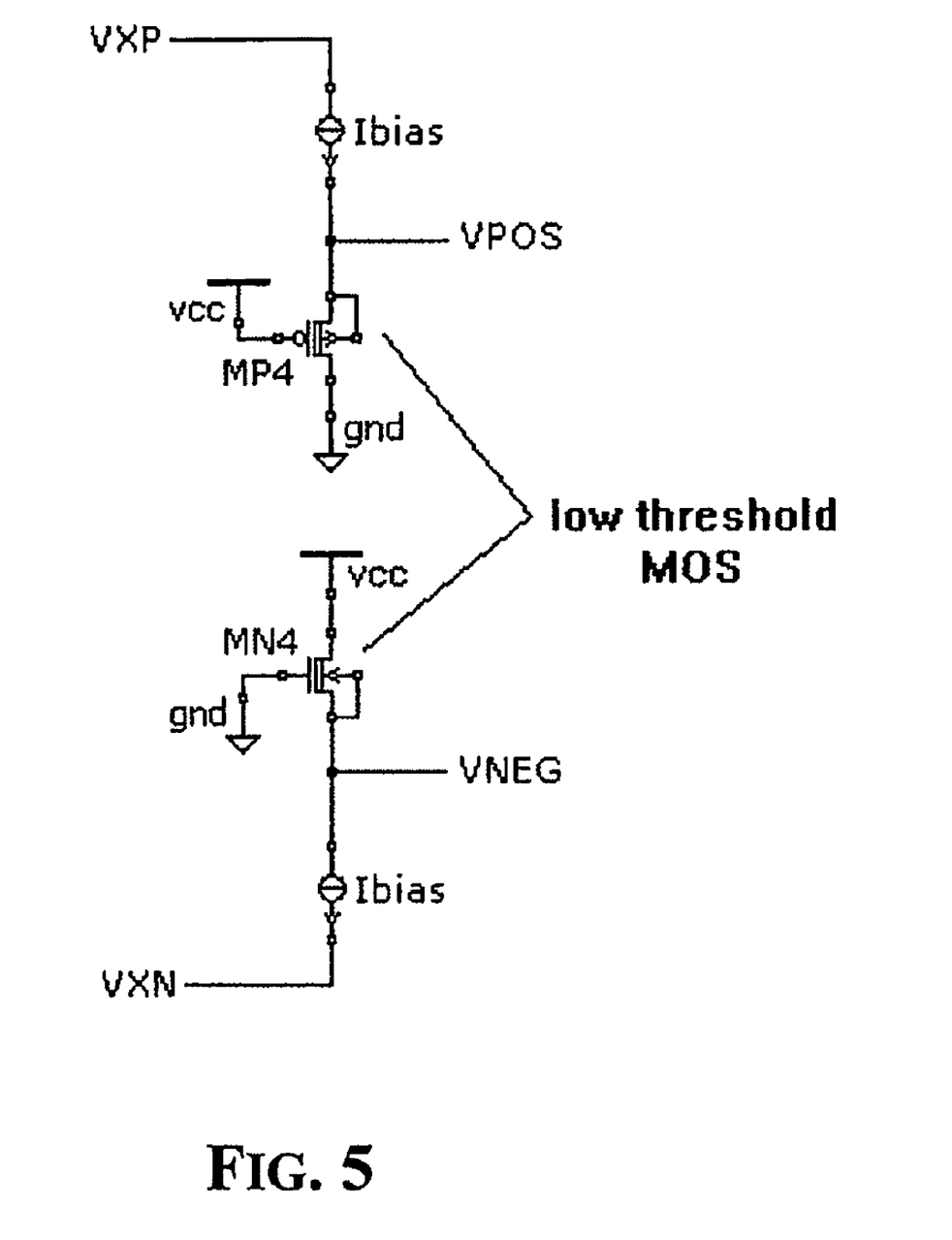
FIG. 5 is a schematic circuit diagram illustrating possible circuits for generating voltages of the respective supply nodes of the inverters that drive the natural or low threshold transistors of the buffer of the present invention.

The voltages VPOS and VNEG can be generated by simple source followers input with a boosted voltage that is normally available in many integrated systems, such as for example nonvolatile memory devices. FIG. 5 depicts basic diagrams of these source followers.

In general, positive boosted voltages are always available both during normal functioning mode and in stand-by functioning mode of the integrated system. A negative boosted voltage may not be available in certain devices. In these cases, since $\delta$ is very small, a very small (in terms of silicon area occupation and power consumption) single stage charge pump that uses the same clock signal of the available positive charge pump will suffice.

Figure 6:
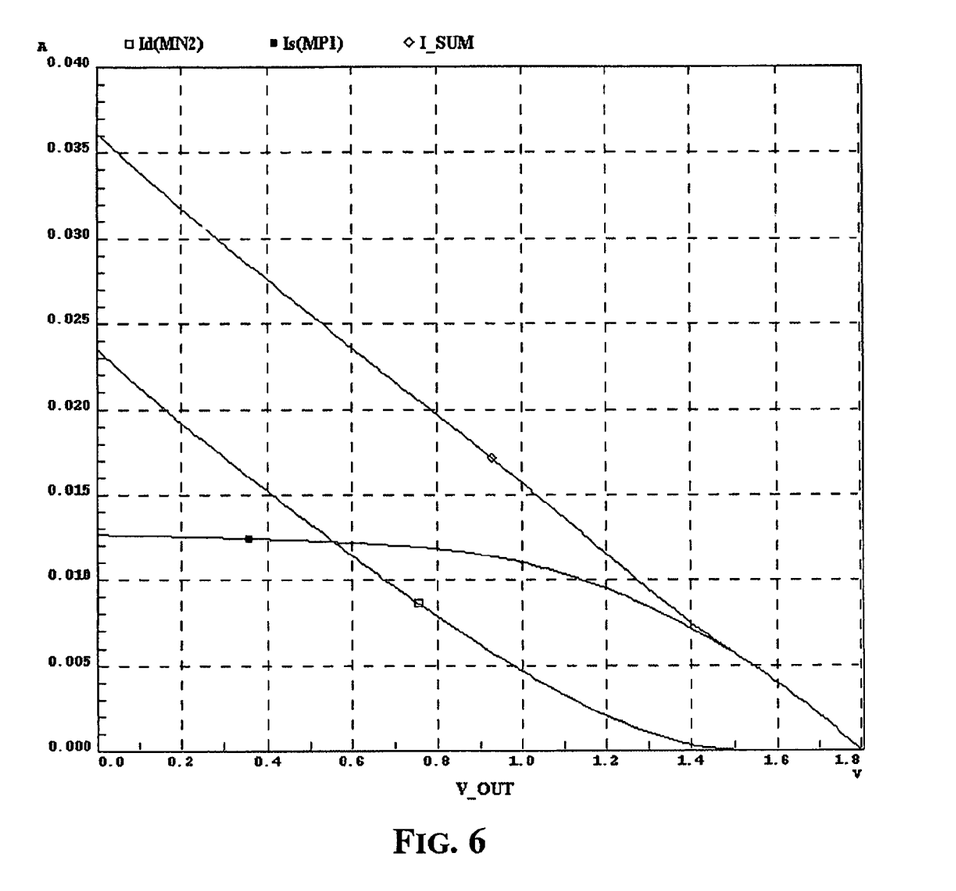
FIG. 6 is a graph depicting the current absorbed by the enhancement PMOS and by the natural NMOS of the pull-up side of the buffer of the present invention and their sum.

The decisive advantage of the circuit of the present approach depicted in FIGS. 4 and 5 may be observed from the graph of FIG. 6. The graph relates to the pull-up side of the output buffer supplied at Vcc=1.8V. The output voltage Vout is on the x-axis. The three waveforms show the currents absorbed by the natural NMOS Id(MN2), by the enhancement PMOS Is(MP1) and their sum I_SUM. Because of the low threshold voltage, the natural NMOS is not in a conducting state when the PMOS is fully in its "triode" region and the characteristic I_SUM is not piecewise and practically linear. The output resistance is about 50Ω.

Figure 7:
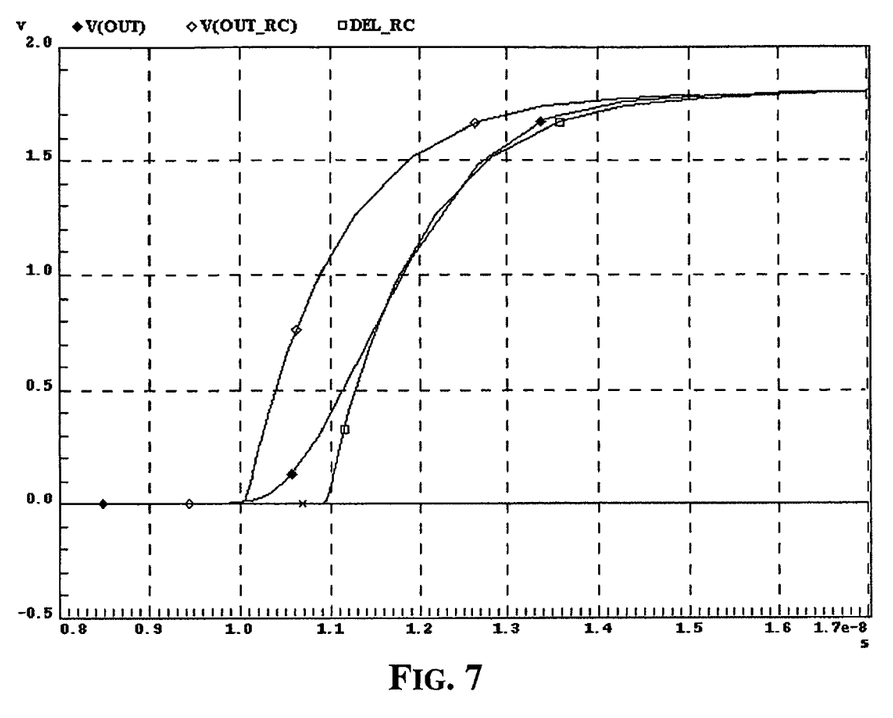
FIG. 7 is a graph comparing a dynamic response of the buffer of the present invention with the same response of a common RC filter of the first order.

FIG. 7 shows, for the pull-up side, the dynamic functioning of the buffer, that is the functioning in the time domain of the output signal V(OUT) of the buffer for a capacitive load of 20 pF, and the time evolution of the delayed replica DEL_RC of the output signal V(OUT_RC) of a first order RC filter composed of a 50Ω resistor and of a 20 pF capacitor. The initial difference is due to the gate slew limiter GSL that limits the slope of the current absorbed by the driving inverter. The output waveform of the buffer substantially superposes to that of the RC filter, thus the functioning of the buffer is almost ideal.

To limit the influence of the bias currents Ibias on the overall power consumption in a stand-by state or self-standby state, it is possible to use a time division biasing technique according to the prior Italian patent application No. VA2006A000071 filed on Dec. 5, 2006, in the name of the same applicant, the disclosure of which is herein incorporated by reference.

Figure 8:
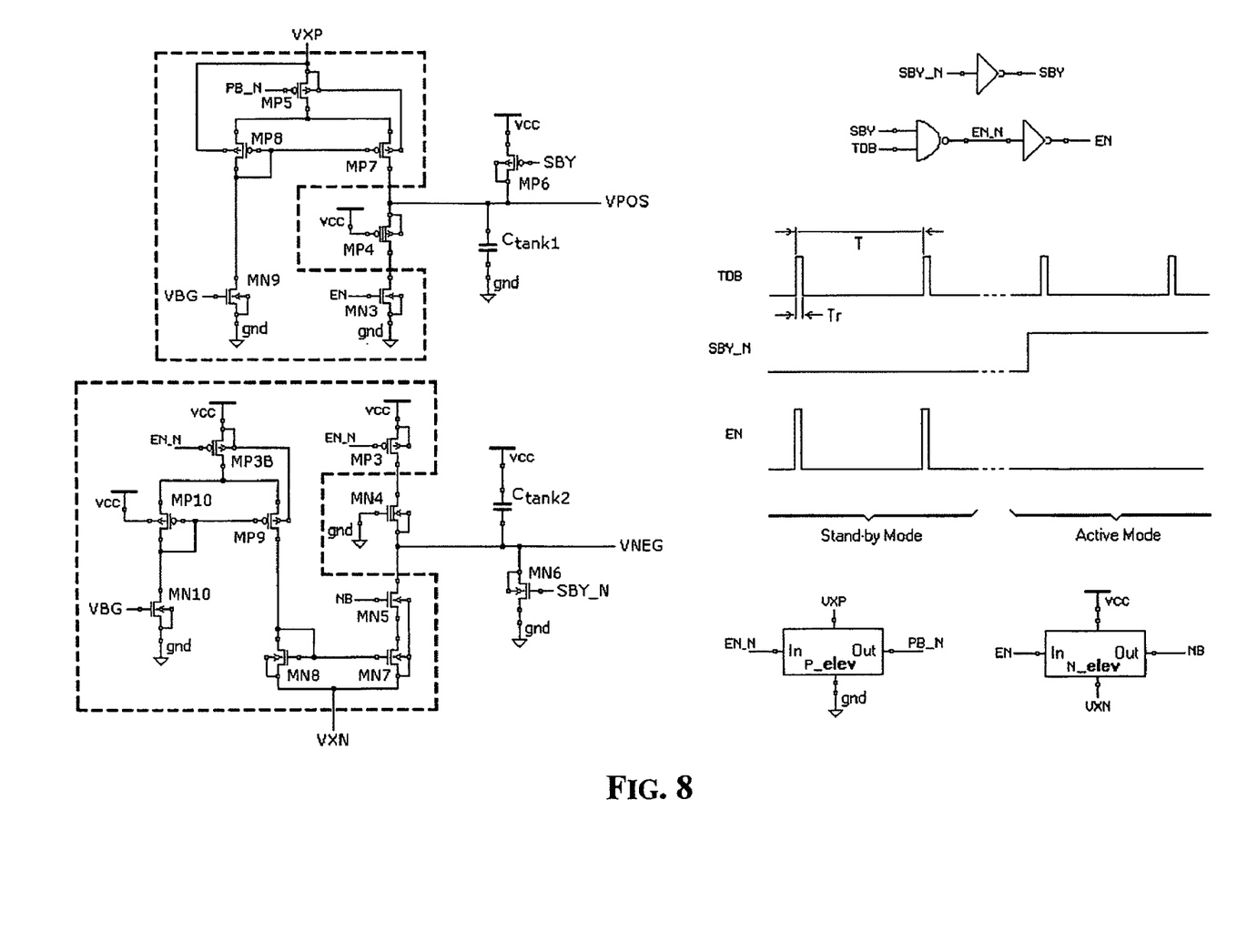
FIG. 8 is a schematic diagram illustrating an embodiment of the circuits for generating the voltages of the respective supply nodes of the inverters for driving the natural or low threshold transistors of the circuit of the buffer of the present invention to reduce or minimize the current consumption.

An embodiment that implements a time division biasing is depicted in FIG. 8. The dashed perimeters outline bias current generators. These currents are generated by the MOS MN9 and MN10, the gate node of which is controlled with a stable reference voltage insensitive to supply voltage fluctuations, temperature variations and process spread (for example a band-gap voltage generator) and fed to the source followers MP4 and MN4 through the current mirrors (MP7-MP8, MP9-MP10 and MN7-MN8) and the transistors functioning as switches (MP5-MN3, MP3B-MP3-MN5).

In a stand-by condition (SBY_N=gnd), the above-mentioned switches are on and the MOS pair MN6-MP6 is off, thus the nodes VPOS and VNEG reach steady-state conditions. Therefore, the switches can be turned off and the generated voltages are kept by the hold capacitors Ctank1 and Ctank2. Remaining in the stand-by condition, periodically the hold capacitors are "refreshed" for compensating the eventual current leakage, that is typically small.

The "refresh" operation is clocked by the signal TDB (see the waveforms depicted in FIG. 8). In the low logic state (TDB=gnd), the enable signal EN=gnd, the inverse replica thereof EN_N=Vcc, the signal PB_N (through the level translator P_elev) reaches the positive boosted voltage VXP and the signal NB (through the level translator N_elev) reaches the negative boosted voltage VXN. In this condition the switches are off and the power consumption is null.

It is evident that by properly designing the size of the current generators and the mirror ratios and with an appropriate choice of the duty-cycle Tr/T of the signal TDB, the power consumption can be reduced to negligible levels. In the active functioning condition (SBY_N=Vcc) the MOS MP6-MN6 are on and the nodes VPOS and VNEG are at the voltage Vcc and at the ground potential, respectively.

There may be a single circuit used for serving a whole bank of output buffers with a limited requirement of silicon area, because the current consumption is small and because it is not necessary to have a high switching speed to a stand-by/self-stand-by functioning condition. The architecture of the output buffer of the present invention fully attains the objective of providing a circuit architecture for high speed buffers that overcomes most of the limits and inefficiencies of the prior circuit architectures discussed above.

By summarizing, the main advantages of the buffer in accordance with features of the present approach are: simple architecture, because natural MOS are used; negligible power consumption in stand-by/self-stand-by conditions; limited silicon area overhead even in case a time division biasing circuit and an eventual small charge pump negative voltage generator are required, that is largely compensated by the fact that it is not necessary to increase the size of the common source output drivers.

Figure 9:
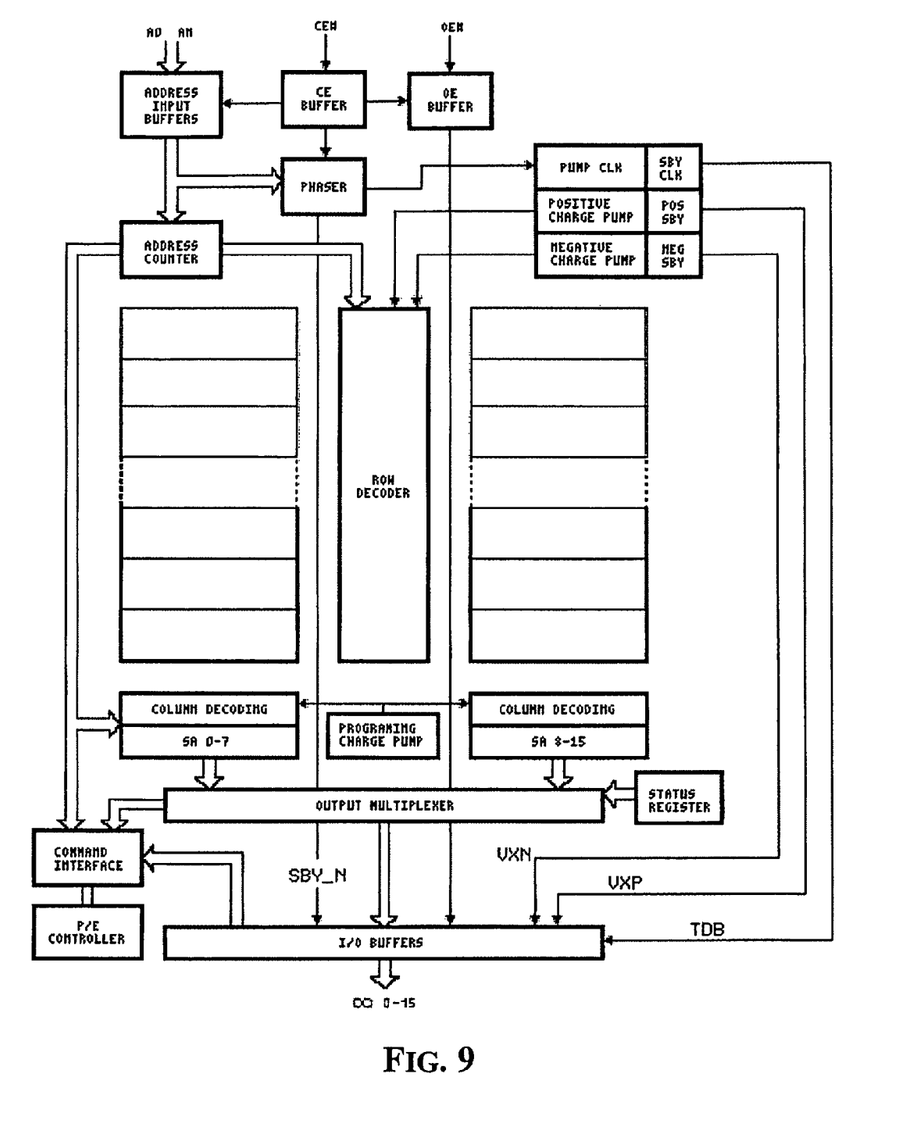
FIG. 9 is a high level schematic diagram of a memory buffer using an array of bidirectional input/output buffers in which the output buffer is realized according to the present invention.

FIG. 9 depicts a nonvolatile memory device using output buffers according to the present approach in an array of I/O buffers. The supply voltages VPOS and VNEG of the driving inverters of the output buffers of the present approach are respectively obtained by the boosted voltages VXP and VXN that are normally generated in nonvolatile memory devices for reading data stored in the memory, for example via the respective generators described with reference to FIG. 8.

The which is claimed is:

1. An output CMOS buffer for use in a digital device comprising:
    a final inverter stage including a first pair of complementary transistors each having a conductivity type, respective gate slew limiters and respective first and second inverters each supplied through the respective gate slew limiter controlling a slope of a gate signal of the gates of the first pair of complementary transistors;
    a second complementary pair of low-threshold transistors connected respectively in parallel to the complementary transistors of opposite conductivity type of the first pair;
    third and fourth inverters and respective gate slew limiters, each of the third and fourth inverters being supplied through the respective gate slew limiter controlling the slope of the gate signal of the gates of the second pair of complementary low-threshold transistors;
    a voltage supply node;
    a reference voltage node;
    a negative voltage node; and
    a positive voltage node;
    the third inverter being connected between the voltage supply node and the negative voltage node, and the fourth inverter being connected between the positive voltage node and the reference voltage node, the negative voltage and the positive voltage on the respective nodes being at least equal to an absolute value of the threshold voltage of the low-threshold transistors.

2. The output CMOS buffer of claim 1, further comprising two source follower circuits respectively including a PMOS low-threshold transistor connected to a boosted positive voltage source and an NMOS low-threshold transistor connected to a boosted negative voltage source, and respectively generating the positive voltage and the negative voltage of the positive and negative voltage nodes connected to the respective third and fourth inverters.

3. The CMOS output buffer of claim 2, wherein a respective hold capacitor is connected to each of the positive and negative voltages; respective current mirrors resistant to supply fluctuations, temperature variations and process spread generate bias currents of the respective PMOS and NMOS low-threshold transistors absorbed by the boosted voltage sources; and the control gates of the PMOS and NMOS low-threshold transistors are controlled by a stand-by signal based upon a time division biasing for reducing current consumption.

4. An output CMOS buffer comprising:
    an inverter stage including a first pair of complementary transistors, respective gate slew limiters and respective first and second inverters each supplied through the respective gate slew limiter via the gates of the first pair of complementary transistors;
    a second complementary pair of low-threshold transistors connected respectively in parallel to the first pair of complementary transistors;
    third and fourth inverters and respective gate slew limiters, each of the third and fourth inverters being supplied through the respective gate slew limiter via the gates of the second pair of complementary low-threshold transistors;
    the third inverter being connected between a voltage supply node and a negative voltage node, and the fourth inverter being connected between a positive voltage node and a reference voltage node;

the negative voltage and the positive voltage on the respective nodes being at least equal to an absolute value of the threshold voltage of the low-threshold transistors.

5. The output CMOS buffer of claim 4, further comprising two source follower circuits respectively including a PMOS low-threshold transistor connected to a boosted positive voltage source and an NMOS low-threshold transistor connected to a boosted negative voltage source, and respectively generating the positive voltage and the negative voltage of the positive and negative voltage nodes connected to the respective third and fourth inverters.

6. The CMOS output buffer of claim 5, wherein a respective hold capacitor is connected to each of the positive and negative voltages; respective current mirrors resistant to supply fluctuations, temperature variations and process spread generate bias currents of the respective PMOS and NMOS low-threshold transistors absorbed by the boosted voltage sources; and the control gates of the PMOS and NMOS low-threshold transistors are controlled by a stand-by signal based upon a time division biasing for reducing current consumption.

7. A nonvolatile memory device comprising:
an array of memory cells;
an array of read amplifiers associated with the array of memory cells;
an output multiplexer input with data read from the array of memory cells by the array of read amplifiers;
an input/output block including an array of output buffers receiving data from the output multiplexer;
each output buffer including
an inverter stage including a first pair of complementary transistors each having a conductivity type, respective gate slew limiters and respective first and second inverters each supplied through the respective gate slew limiter controlling a slope of a gate signal of the gates of the complementary transistors,
a second complementary pair of low-threshold transistors connected respectively in parallel to the complementary transistors of opposite conductivity type of the first pair,
third and fourth inverters and respective gate slew limiters, each of the third and fourth inverters being supplied through the respective gate slew limiter controlling the slope of the gate signal of the gate of the respective complementary low-threshold transistor,
the third inverter being connected between a voltage supply node and a negative voltage node, and the fourth inverter being connected between a positive voltage node and a reference node, the negative voltage and the positive voltage on the respective nodes being at least equal to an absolute value of the threshold voltage of the low-threshold transistors, and
two source follower circuits respectively including a PMOS low-threshold transistor connected to a boosted positive voltage source and an NMOS low-threshold transistor connected to a boosted negative voltage source, and respectively generating the positive voltage and the negative voltage of the positive and negative voltage nodes connected to the respective third and fourth inverters,
wherein a respective hold capacitor is connected to each of the positive and negative voltage, respective current mirrors resistant to supply fluctuations, temperature variations and process spread generate bias currents of the respective PMOS and NMOS low-threshold transistors absorbed by the boosted voltage sources,
the control gates of the PMOS and NMOS low-threshold transistors are controlled by a stand-by signal based upon a time division biasing for reducing current consumption,
each output buffer being associated with a respective hold capacitor the charge state of which is periodically refreshed at each pulse of a refresh signal enabled by a stand-by signal.

8. A method of making an output CMOS buffer comprising:
forming a final inverter stage with a first pair of complementary transistors and respective first and second inverters each supplied through a respective gate slew limiter via the gates of the first pair of complementary transistors;
connecting a second complementary pair of low-threshold transistors respectively in parallel to the first pair of complementary transistors;
providing third and fourth inverters each being supplied through a respective gate slew limiter via the gates of the second pair of complementary low-threshold transistors; and
connecting the third inverter between a voltage supply node and a negative voltage node, and connecting the fourth inverter between a positive voltage node and a reference voltage node;
the negative voltage and the positive voltage on the respective nodes being at least equal to an absolute value of the threshold voltage of the low-threshold transistors.

9. The method of claim 8, further comprising providing two source follower circuits respectively including a PMOS low-threshold transistor connected to a boosted positive voltage source and an NMOS low-threshold transistor connected to a boosted negative voltage source, and respectively generating the positive voltage and the negative voltage of the positive and negative voltage nodes connected to the respective third and fourth inverters.

10. The method of claim 9, further comprising connecting a respective hold capacitor to each of the positive and negative voltages; generating bias currents of the respective PMOS and NMOS low-threshold transistors absorbed by the boosted voltage sources via respective current mirrors resistant to supply fluctuations, temperature variations and process spread; and controlling the control gates of the PMOS and NMOS low-threshold transistors with a stand-by signal based upon a time division biasing for reducing current consumption.

* * * * *